United States Patent
Hong et al.

(10) Patent No.: US 7,459,744 B2
(45) Date of Patent: Dec. 2, 2008

(54) HOT CARRIER INJECTION PROGRAMMABLE STRUCTURE INCLUDING DISCONTINUOUS STORAGE ELEMENTS AND SPACER CONTROL GATES IN A TRENCH AND A METHOD OF USING THE SAME

(75) Inventors: Cheong M. Hong, Austin, TX (US); Chi-Nan Li, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 9 days.

(21) Appl. No.: 11/525,747

(22) Filed: Sep. 22, 2006

(65) Prior Publication Data

US 2007/0020851 A1    Jan. 25, 2007

Related U.S. Application Data

(62) Division of application No. 11/188,604, filed on Jul. 25, 2005, now Pat. No. 7,112,490.

(51) Int. Cl.
*H01L 27/108* (2006.01)
*H01L 21/336* (2006.01)
*G01C 11/34* (2006.01)

(52) U.S. Cl. ............... 257/302; 257/330; 257/242; 257/E29.26; 257/E29.257; 438/259; 438/270; 438/271; 438/589

(58) Field of Classification Search ............ 257/E29.26, 257/E29.257, 302, E29.201, 330, 156, 242, 257/259; 365/185.18; 438/156, 158, 206, 438/212, 268, 259, 270, 271, 589
See application file for complete search history.

(56) References Cited

U.S. PATENT DOCUMENTS

| | | | |
|---|---|---|---|
| 4,184,207 A | 1/1980 | McElroy |
| 4,751,558 A | 6/1988 | Kenney |
| 4,785,337 A | 11/1988 | Kenney |
| 4,833,094 A | 5/1989 | Kenney |
| 4,860,070 A | 8/1989 | Arimoto et al. |
| 5,196,722 A | 3/1993 | Bergendahl et al. |
| 5,252,845 A | 10/1993 | Kim et al. |
| 5,315,142 A | 5/1994 | Acovic et al. |

(Continued)

OTHER PUBLICATIONS

Actions on the Merits by U.S.P.T.O, as of Jul. 26, 2007, 8 pages.

(Continued)

*Primary Examiner*—Long K Tran

(57) ABSTRACT

A programmable storage device includes a first diffusion region underlying a portion of a first trench defined in a semiconductor substrate and a second diffusion region occupying an upper portion of the substrate adjacent to the first trench. The device includes a charge storage stack lining sidewalls and a portion of a floor of the first trench. The charge storage stack includes a layer of discontinuous storage elements (DSEs). Electrically conductive spacers formed on opposing sidewalls of the first trench adjacent to respective charge storage stacks serve as control gates for the device. The DSEs may be silicon, polysilicon, metal, silicon nitride, or metal nitride nanocrystals or nanoclusters. The storage stack includes a top dielectric of CVD silicon oxide overlying the nanocrystals overlying a bottom dielectric of thermally formed silicon dioxide. The device includes first and second injection regions in the layer of DSEs proximal to the first and second diffusion regions.

20 Claims, 4 Drawing Sheets

U.S. PATENT DOCUMENTS

| | | | |
|---|---|---|---|
| 5,411,905 A | 5/1995 | Acovic et al. |
| 5,432,365 A | 7/1995 | Chin et al. |
| 5,460,988 A | 10/1995 | Hong |
| 5,567,635 A | 10/1996 | Acovic et al. |
| 5,705,415 A | 1/1998 | Orlowski et al. |
| 5,721,448 A | 2/1998 | Hauf et al. |
| 5,786,612 A | 7/1998 | Otani et al. |
| 5,801,415 A | 9/1998 | Lee et al. |
| 5,824,580 A | 10/1998 | Hauf et al. |
| 5,907,775 A | 5/1999 | Tseng |
| 5,914,523 A | 6/1999 | Bashir et al. |
| 5,923,046 A | 7/1999 | Tezuka et al. |
| 5,969,383 A | 10/1999 | Chang et al. |
| 5,998,263 A | 12/1999 | Sekariapuram et al. |
| 6,074,954 A | 6/2000 | Lill et al. |
| 6,117,733 A | 9/2000 | Sung et al. |
| 6,121,148 A | 9/2000 | Bashir et al. |
| 6,133,601 A | 10/2000 | Watanabe |
| 6,172,905 B1 | 1/2001 | White et al. |
| 6,228,706 B1 | 5/2001 | Horak et al. |
| 6,265,268 B1 | 7/2001 | Halliyal et al. |
| 6,281,064 B1 | 8/2001 | Mandelman et al. |
| 6,287,917 B1 | 9/2001 | Park et al. |
| 6,307,782 B1 | 10/2001 | Sadd et al. |
| 6,320,784 B1 | 11/2001 | Muralidhar et al. |
| 6,330,184 B1 | 12/2001 | White et al. |
| 6,365,452 B1 | 4/2002 | Perng et al. |
| 6,368,916 B1 | 4/2002 | Nakagawa |
| 6,372,617 B1 | 4/2002 | Kitamura |
| 6,373,096 B1 | 4/2002 | Hisamune et al. |
| 6,399,441 B1 | 6/2002 | Ogura et al. |
| 6,461,905 B1 | 10/2002 | Wang et al. |
| 6,486,028 B1 | 11/2002 | Chang et al. |
| 6,537,870 B1 | 3/2003 | Shen |
| 6,544,827 B2 | 4/2003 | Abiko |
| 6,555,427 B1 | 4/2003 | Shimizu et al. |
| 6,559,032 B2 | 5/2003 | Gonzalez et al. |
| 6,583,466 B2 | 6/2003 | Lin et al. |
| 6,620,664 B2 | 9/2003 | Ma et al. |
| 6,638,810 B2 | 10/2003 | Bakli et al. |
| 6,673,681 B2 | 1/2004 | Kocon et al. |
| 6,674,120 B2 | 1/2004 | Fujiwara |
| 6,677,204 B2 | 1/2004 | Cleeves et al. |
| 6,687,156 B2 | 2/2004 | Kobayashi et al. |
| 6,706,599 B1 | 3/2004 | Sadd et al. |
| 6,709,922 B2 | 3/2004 | Ebina et al. |
| 6,713,834 B2 | 3/2004 | Mori et al. |
| 6,734,492 B2 | 5/2004 | Yamazaki et al. |
| 6,747,308 B2 | 6/2004 | Mitros et al. |
| 6,750,499 B2 | 6/2004 | Wu |
| 6,762,092 B2 | 7/2004 | Yuan et al. |
| 6,803,620 B2 | 10/2004 | Moriya et al. |
| 6,816,414 B1 | 11/2004 | Prinz |
| 6,818,508 B2 | 11/2004 | Shimizu et al. |
| 6,818,512 B1 | 11/2004 | Hsieh |
| 6,818,939 B1 | 11/2004 | Hadizad |
| 6,853,587 B2 | 2/2005 | Forbes |
| 6,864,540 B1 | 3/2005 | Divakaruni et al. |
| 6,894,339 B2 | 5/2005 | Fan et al. |
| 6,903,418 B2 | 6/2005 | Iwamoto et al. |
| 6,916,715 B2 | 7/2005 | Hsiao et al. |
| 6,936,887 B2 | 8/2005 | Harari et al. |
| 6,952,034 B2 * | 10/2005 | Hu et al. ............. 257/315 |
| 6,998,313 B2 | 2/2006 | Lin |
| 7,015,537 B2 | 3/2006 | Lee et al. |
| 7,045,423 B2 | 5/2006 | Ichige et al. |
| 7,078,286 B1 | 7/2006 | Mehta |
| 7,098,502 B2 | 8/2006 | Mathew et al. |
| 7,112,490 B1 | 9/2006 | Hong et al. |
| 7,122,432 B2 | 10/2006 | Shimizu et al. |
| 7,196,935 B2 | 3/2007 | Forbes |
| 7,199,419 B2 | 4/2007 | Haller |
| 7,220,634 B2 | 5/2007 | Prall et al. |
| 7,259,984 B2 | 8/2007 | Kan et al. |
| 7,371,642 B2 | 5/2008 | Forbes |
| 2002/0151136 A1 | 10/2002 | Lin et al. |
| 2003/0068864 A1 | 4/2003 | Il-Yong et al. |
| 2004/0000688 A1 | 1/2004 | Harari et al. |
| 2004/0248371 A1 | 12/2004 | Wang |
| 2005/0037576 A1 | 2/2005 | Chen et al. |
| 2005/0146938 A1 * | 7/2005 | Forbes ............. 365/185.18 |
| 2005/0148173 A1 | 7/2005 | Shone |
| 2005/0242391 A1 | 11/2005 | She et al. |
| 2005/0280089 A1 | 12/2005 | Forbes |
| 2005/0280094 A1 | 12/2005 | Forbes |
| 2006/0011966 A1 | 1/2006 | Wang |
| 2006/0046383 A1 | 3/2006 | Chen et al. |
| 2006/0131640 A1 | 6/2006 | Yu et al. |
| 2006/0152978 A1 | 7/2006 | Forbes |
| 2006/0166443 A1 | 7/2006 | Forbes |

OTHER PUBLICATIONS

U.S. Appl. No. 11/626,762, filed Jan. 24, 2007.
U.S. Appl. No. 11/626,753, filed Jan. 24, 2007.
U.S. Appl. No. 11/626,768, filed Jan. 24, 2007.
Guan, H., et al. "An Analytical Model for Optimization of Programming Efficiency and Uniformity of Split Gate Source-Side Injection Superflash Memory," IEEE Transactions on Electron Devices, vol. 50, No. 3, pp. 809-815, Mar. 2003.
Hayashi, Y., et al. "Twin MONOS Cell with Dual Control Gates," 2000 Symposium on VLSI Technology Digest of Technical Papers, pp. 122-123, 2000.
Lee, D., et al. "Vertical Floating-Gate 4.5F2 Split-Gate NOR Flash Memory at 110nm Node," 2004 Symposium on VLSI Technology Digest of Technical Papers, pp. 72-73, 2004.
Ma, Y. et al. "A Dual-Bit Split-Gate EEPROM (DSG) Cell in Contactless Array for Single-Vcc High Density Flash Memories," IEDM, p. 57-60, 1994.
Osabe, T. et al. "Charge-Injection Length in Silicon Nanocrystal Memory Cells," 2004 Symposium on VLSI Technology Digest of Technical Papers p. 242-243, 2004.
Van Houdt, J., et al. "An Analytical Model for the Optimization of Source-Side Injection Flash EEPROM Devices," IEEE Transactions on Electron Devices, vol. 42, No. 7, pp. 1314-1320, Jul. 1995.
U.S. Appl. No. 10/961,295, filed Oct. 8, 2004.
U.S. Appl. No. 11/079,674, filed Mar. 14, 2005.
U.S. Appl. No. 11/188,585, filed Jul. 25, 2005.
U.S. Appl. No. 11/188,935, filed Jul. 25, 2005.
U.S. Appl. No. 11/188,584, filed Jul. 25, 2005.
U.S. Appl. No. 11/188,999, filed Jul. 25, 2005.
U.S. Appl. No. 11/188,953, filed Jul. 25, 2005.
U.S. Appl. No. 11/188,898, filed Jul. 25, 2005.
U.S. Appl. No. 11/188,910, filed Jul. 25, 2005.
U.S. Appl. No. 11/188,909, filed Jul. 25, 2005.
U.S. Appl. No. 11/188,591, filed Jul. 25, 2005.
U.S. Appl. No. 11/188,939, filed Jul. 25, 2005.
U.S. Appl. No. 11/188,588, filed Jul. 25, 2005.
U.S. Appl. No. 11/188,603, filed Jul. 25, 2005.
U.S. Appl. No. 11/188,615, filed Jul. 25, 2005.
U.S. Appl. No. 11/188,582, filed Jul. 25, 2005.
U.S. Appl. No. 11/188,583, filed Jul. 25, 2005.
U.S. Appl. No. 11/834,391, filed Aug. 6, 2007.
Actions on the Merits by U.S.P.T.O, as of Nov. 8, 2007, 10 pgs.
Actions on the Merits by U.S.P.T.O, as of Apr. 16, 2008, 12 pgs.
Yang, Edward S., "8-3 Channel Conductance", Fundamentals of Semiconductor Devices, McGraw-Hill Book Company, p. 205, 1978.
Actions on the Merits by U.S.P.T.O, as of Jul. 25, 2008, 13 pgs.

* cited by examiner

HCI PROGRAM/ERASE TABLE

| OPERATION | CG 140-1 | CG 140-2 | DIFF 152 | S/D 150-1 | S/D 150-2 | WELL 102 |
|---|---|---|---|---|---|---|
| INJECTION REGION 114-1 | $V_{P2}$ | | $V_{P1}$ | $V_{P4}$ | | $V_{P4}$ |
| INJECTION REGION 114-2 | $V_{P2}$ | | $V_{P4}$ | $V_{P1}$ | | $V_{P4}$ |
| INJECTION REGION 114-3 | | $V_{P2}$ | $V_{P1}$ | | $V_{P4}$ | $V_{P4}$ |
| INJECTION REGION 114-4 | | $V_{P2}$ | $V_{P4}$ | | $V_{P1}$ | $V_{P4}$ |
| ERASE | $V_{E1}$ | | X | | X | $V_{E2}$ |

$V_{P1}= 5V$   $V_{P4}= 0V$   $V_{E1}= -6V$   X=No Connect
$V_{P2}= 6V$                 $V_{E2}= 6V$

US 7,459,744 B2

HOT CARRIER INJECTION PROGRAMMABLE STRUCTURE INCLUDING DISCONTINUOUS STORAGE ELEMENTS AND SPACER CONTROL GATES IN A TRENCH AND A METHOD OF USING THE SAME

RELATED APPLICATION

This is a divisional application of and claims priority under 35 U.S.C. § 120 to U.S. patent application Ser. No. 11/188,604 entitled "Hot Carrier Injection Programmable Structure Including Discontinuous Storage Elements and Spacer Control Gates in a Trench," by Hong et al., filed Jul. 25, 2005, which is assigned to the current assignee hereof and incorporated by reference in its entirety.

FIELD OF THE DISCLOSURE

The disclosure is related to the field of semiconductor devices and, more particularly, nonvolatile storage devices.

RELATED ART

Nonvolatile storage is an important element in the design of substantially all electronic devices. In the field of wireless and portable electronic devices, nonvolatile storage must be compact and consume little power. Various nonvolatile storage cells have been proposed and implemented. Included among these conventional cells are planar storage cells and storage cells employing floating gates as a charge storage element. A planar storage cell is characterized by a planar transistor channel region typically located in proximity to an upper surface of the wafer substrate. While planar technology is mature and well understood, planar devices consume an undesirably large amount of wafer area.

With respect to the charge storage element, conventional floating gates have been made of a contiguous strip of a conductive material such as polysilicon. Conductive floating gates present a problem in devices with very thin dielectrics. Thin dielectrics are particularly susceptible to pin hole defects. With a conductive floating gate, all of the stored charge on the floating gate can leak off through a single pin hole defect in the dielectric. Moreover, conventional floating gates are not suitable for localized programming in which injected electrons are confined to a specific location of the charge storage element. Localized programming offers the prospect of multiple bit storage cell, where each bit is associated with a specific region of the charge storage element. Accordingly, it would be desirable to implement a multiple bit storage device suitable for use in an advanced processes employing very thin dielectrics where the design of the implemented device consumes less area than planar devices and devices employing conventional charge storage elements.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a semiconductor-based storage cell and a corresponding fabrication process employ a trench etched into a semiconductor substrate, a charge storage layer lining the trench, and a control gate spacer on the trench sidewall adjacent to the charge storage layer. Diffusion regions are located underlying a portion of the trench and adjacent to the trench at an upper surface of the substrate. The charge storage layer preferably includes a set of discontinuous storage elements (DSEs). In this embodiment, the DSEs may be silicon nanocrystals or silicon nanoclusters, which are small, discreet silicon structures embedded in a dielectric layer and capable of holding a positive or negative charge. Because DSEs are not physically or electrically connected to each other, DSEs are less susceptible to charge loss through pin holes in the dielectric layer than conventional storage elements such as conventional polysilicon floating gate structures. The preferred implementation of the storage device is capable of storing multiple bits of information using hot carrier injection (HCI) programming.

Figure 1:
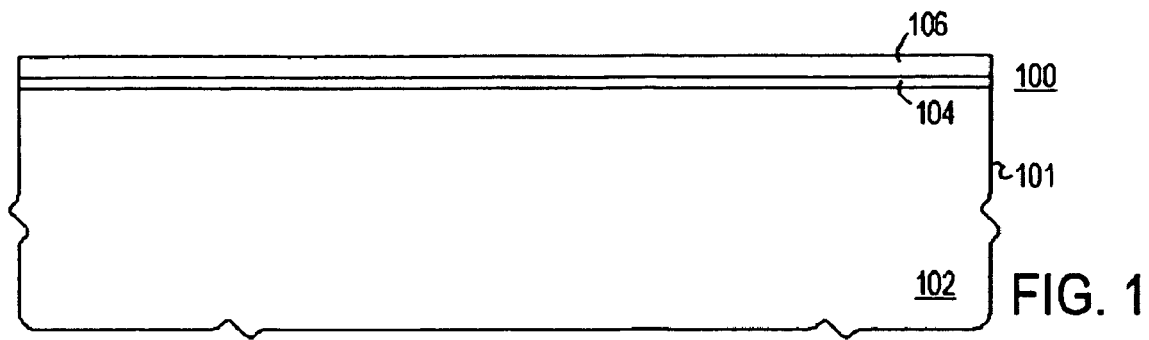
FIG. 1 is a partial cross sectional view of a wafer at an intermediate stage in a fabrication process in which a hard mask is formed on a dielectric liner over a semiconductor substrate of a wafer.

Referring to the drawings, FIG. 1 through FIG. 9 depict a set of partial cross sectional views of a semiconductor wafer at various stages in one embodiment of a process for fabricating a nonvolatile storage device 100. In FIG. 1, a dielectric liner 104 and a hard mask 106 are formed on an upper surface of a semiconductor substrate 102 of a semiconductor wafer 101. Semiconductor substrate is preferably doped or undoped monocrystalline silicon. In other embodiments, semiconductor substrate 102 may include other semiconductors such as germanium or various semiconductor alloys such as the III-V semiconductor alloys including gallium arsenide. In another embodiment, substrate 102 is a semiconductor on insulator (SOI) substrate.

In one embodiment, dielectric liner 104 is silicon oxide, which may be thermally formed (grown) or deposited using CVD (chemical vapor deposition). Hard mask 106 is preferably a dielectric that can be selectively etched with respect to substrate 102. Hard mask 106 is preferably CVD silicon nitride, which is desirable for its ability to inhibit oxidation of an underlying semiconductor thereby providing a mask for a thermal oxidation process.

Figure 2:
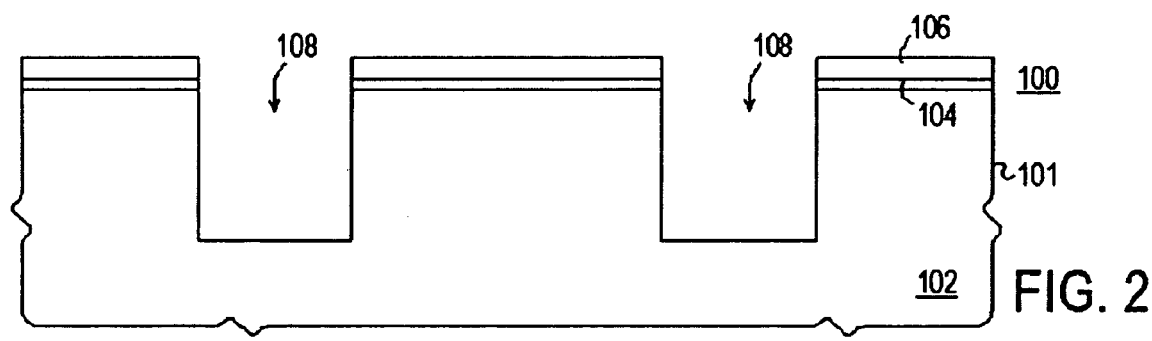
FIG. 2 depicts processing subsequent to FIG. 1 in which trenches are formed in the semiconductor substrate.

Referring now to FIG. 2, trenches 108 are formed in semiconductor substrate 102. Trenches 108 define the basic structure of the storage device to be formed. Formation of trenches 108 includes conventional photolithographic patterning of dielectric liner 104 and hard mask 106, followed by a dry etch process that etches the semiconductor material (e.g., silicon) preferentially with respect to liner 104 and hard mask 106. Etch processes of this type are well known in the field of semiconductor fabrication. In the depicted implementation, trenches 108 have an aspect of approximately 1:2. A depth of trenches 108 is an implementation detail, but trenches having a depth in the range of approximately 50 nm to 300 nm are desirable for applications requiring a dense storage array.

Figure 3:
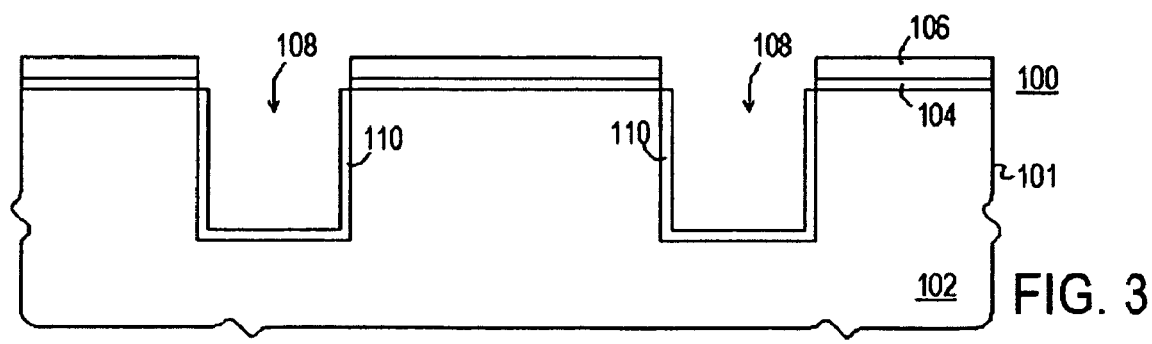
FIG. 3 depicts processing subsequent to FIG. 2 in which the trenches are lined with a bottom dielectric.

In FIG. 3, a first step in the formation of a charge storage stack includes the formation of a dielectric, referred to herein as bottom dielectric 110, on the sidewalls and floor of trenches 108. Bottom dielectric 110 is preferably a thin (e.g., 1 nm to 10 nm) high quality dielectric that is employed in the programming and erasing of DSEs that will be formed subsequently. A thin dielectric may be advantageously used to achieve adequate programming times using either injection-based or tunneling-based programming techniques. A high quality dielectric may be advantageously used to withstand the potentially large programming voltages and currents and the potentially large number of programming cycles without exhibiting breakdown or significant leakage. In the preferred embodiment, bottom dielectric 110 is a thermally formed silicon dioxide film having a thickness in the range of approximately 4 to 10 nm. As depicted in FIG. 3, where hard mask 106 is a silicon nitride hard mask, thermal oxidation of the trench walls does not substantially increase the thickness of dielectric liner 104 even for embodiment in which dielectric liner 104 is a silicon oxide. Dielectric liner 104 may include multiple layers of different films.

Figure 4:
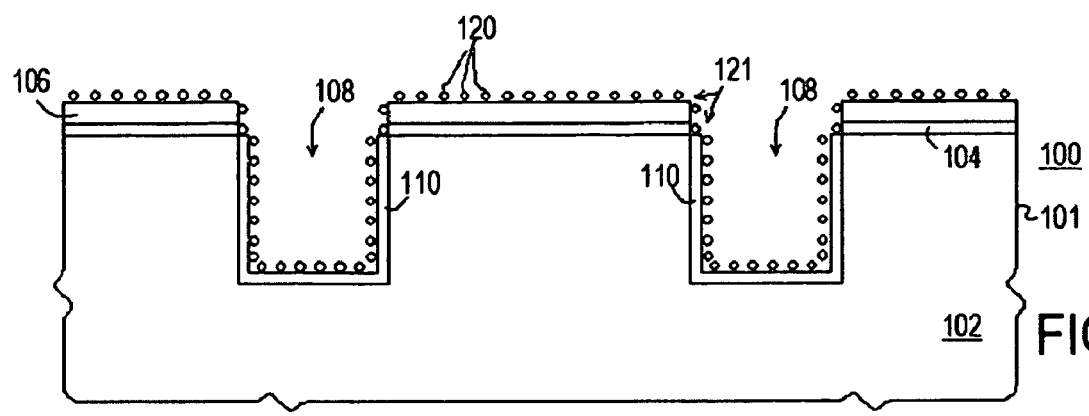
FIG. 4 depicts processing subsequent to FIG. 3 in which a layer of discontinuous storage elements is deposited.

In FIG. 4, a charge storage layer 121 has been non-selectively formed on bottom oxide 110 and an upper surface of hard mask 106. Charge storage layer 121 represents the structure in or on which charge will be stored to program the bit or bits of storage device 100. In the depicted embodiment, charge storage layer 121 includes a plurality of DSEs 120. DSEs 120, implemented in FIG. 4 as nanocrystals, are a set of discreet accumulations of a material capable of storing a charge. Suitable materials include silicon, polysilicon, various metals, and dielectrics such as silicon nitride, silicon oxynitride, and metal nitrides such as tungsten nitride.

In the preferred implementation, DSEs 120 are silicon DSEs (silicon nanocrystals). In this implementation, DSEs 120 may be formed in any one of a variety of ways, preferably without requiring any photolithography steps. One well-known DSE formation technique is to deposit an amorphous silicon layer and heat it to form the nanocrystals. Another technique is to deposit the nanocrystals using chemical vapor deposition (CVD). DSEs may have various shapes, including hemispherical and spherical, depending upon the deposition technique employed. In one implementation, DSEs 120 are approximately 10 nm in diameter and are spaced at a predominantly uniform spacing of approximately 10 nm. Regardless of the formation technique used, each DSE 120 is a particle of silicon that is electrically and physically isolated from its neighbors. Alternative materials, including dielectric materials such as silicon nitride may also be used for DSEs.

Figure 5:
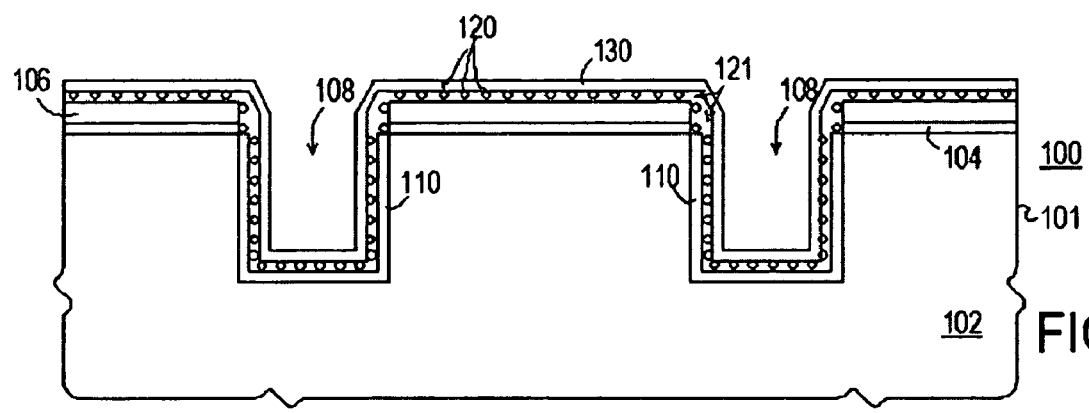
FIG. 5 depicts processing subsequent to FIG. 4 in which a top dielectric is formed on the layer of discontinuous storage elements to form a charge storage stack.

Referring to FIG. 5, a top dielectric 130 has been non-selectively formed overlying charge storage layer 121 to complete the formation of charge storage stack 131, which includes bottom dielectric 110, charge storage layer 121 (FIG. 4), and top dielectric 130. In the preferred embodiment, top dielectric 130 is a high temperature oxide (HTO) desirable because it exhibits characteristics (e.g., density and dielectric strength) substantially equivalent to thermally formed silicon dioxide. In this embodiment, the HTO may be formed by a conventional HTO process such as reacting dichlorosilane and nitrous oxide at temperatures approaching 900° C. In other embodiments, it may be desirable to employ a lower temperature process (e.g., a TEOS (tetraethylorthosilicate) process) to guard against unintended oxidation of the silicon embodiments of DSEs 120. A thickness of top dielectric 130 is preferably in the range of approximately 5 to 10 nm. Top dielectric 130 may include multiple layers of different materials.

Figure 6:
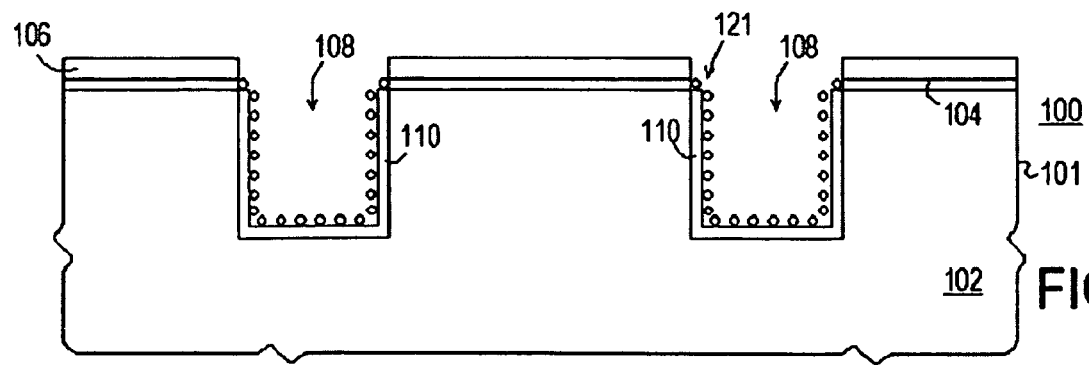
FIG. 6 depicts processing subsequent to FIG. 5 in which portions of the charge storage stack are removed.

Turning now to FIG. 6, portions of the charge storage stack 131 are selectively removed from the upper surface of substrate 102 so that the charge storage stack 131 remains on the floor and sidewalls of trench 108. In one embodiment, selective removal of the charge storage stack 131 includes a polish process, an etchback, or a combination thereof. The implementation depicted in FIG. 6 removes the DSEs 120 and top dielectric 130. In this implementation, retaining the hard mask 106 facilitates an embodiment of the processing depicted in FIG. 6 that uses a CMP process by providing a suitable polish stop layer for the CMP.

Figure 7:
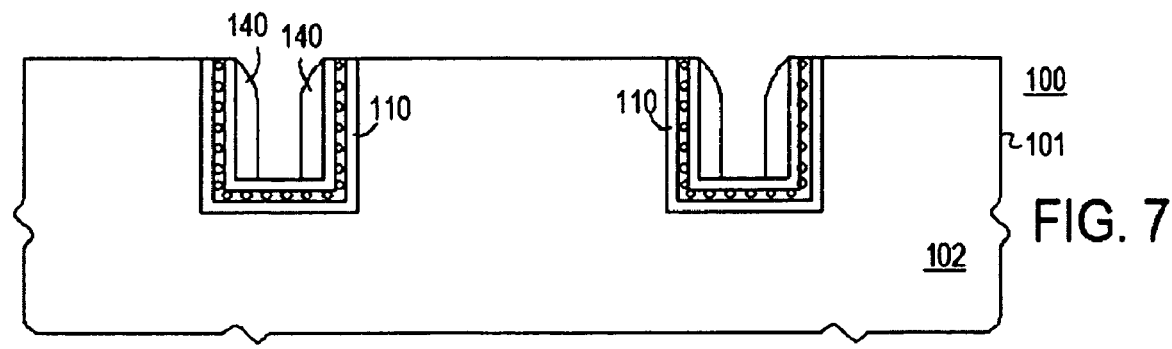
FIG. 7 depicts processing subsequent to FIG. 6 in which conductive spacers are formed on the trench sidewalls adjacent to the charge storage stack.

Turning now to FIG. 7, electrically conductive control gates spacers 140 are formed on sidewalls of trenches 108 adjacent to the charge storage stack 131. Following formation of the spacers 140, the remaining portions of hard mask 106 are removed. As depicted in FIG. 7, spacers 140 are located on top of the portion of the charge storage stack 131 covering the floor of trench 108 as well as adjacent to the portion of charge storage stack 131 that lines the trench sidewalls. In the depicted embodiment, the width of spacers 140 is controlled so that a gap 145 exists between the spacers exposing a portion of charge storage stack 131 on the trench floor. In one embodiment, control gate spacers 140 are formed by conventional CVD of a conformal polysilicon layer followed by an anisotropic polysilicon etch processing according to well known spacer formation techniques. In other embodiments, control gate spacers 140 are of a metal material (e.g., titanium) or another suitable conductive material.

Figure 8:
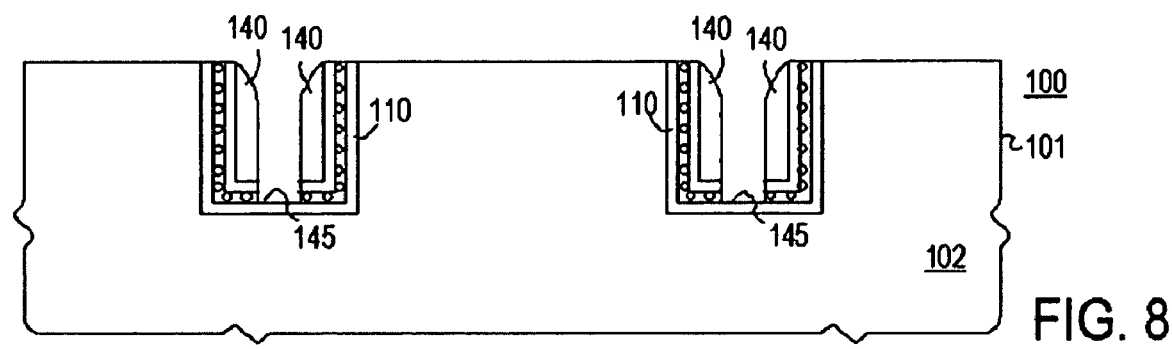
FIG. 8 depicts processing subsequent to FIG. 7 portions of the charge storage stack not covered by the spacers are removed.

FIG. 8 depicts processing subsequent to FIG. 7 in which portions of charge storage stack 131 within gap 145 are removed. In one embodiment, the entire charge storage stack 131 is removed in the gap 145 between spacers 140 to expose a portion of substrate 102 in the vicinity of gap 145. In another embodiment, at least some of gate stack 131 is left intact. In one embodiment, for example, all or some of bottom dielectric 110 is left intact while the DSEs 120 and top dielectric 130 are removed. This latter embodiment beneficially preserves a thin dielectric on the substrate 102 within the gap 145 in preparation for a subsequent implantation step. The use of a pad oxide in connection with an ion implantation is well known.

Figure 9:
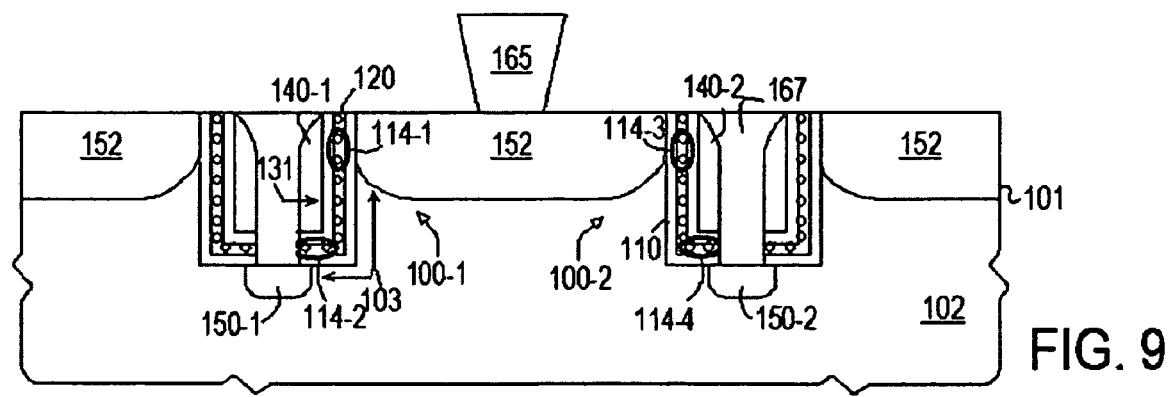
FIG. 9 depicts processing subsequent to FIG. 8 in which diffusion regions are formed in exposed portions of the substrate.

Referring now to FIG. 9, diffusion regions 152, 150-1 and 150-2 (generically or collectively referred to as diffusion region(s) 150) are formed, preferably simultaneously, where diffusion regions 150 underlie gaps 145 between control gate spacers 140 while diffusion regions 152 occupy an upper portion of substrate 102 between adjacent trenches 108 in substrate 102. Diffusion regions 150 and 152 are of the same conductivity type (e.g., n-type for NMOS embodiments), which is opposite the conductivity type of substrate 102 (e.g., p-type for NMOS embodiments). In one embodiment, diffusion regions 150 and 152 are formed using an ion implantation process with a conventional source/drain implant (e.g., phosphorous or arsenic for NMOS or boron for PMOS). Following implantation, a diffusion step is performed by exposing the wafer to an elevated temperature for a specified duration. In addition to the formation of diffusion regions 150 and 152, FIG. 9 further depicts the formation of a contact 165 to diffusion region 152 between adjacent trenches. The gap defined by the control gate spacers 140 is shown in FIG. 9 as being completely filled with a polished plug structure 167. In one embodiment, plug structure 167 is a dielectric that insulates control gates 140 and diffusion regions 150 within the array. In another embodiment, plug 167 includes a dielectric lining and a conductive center to enable a "local" contact to diffusion region 150.

Those skilled in the field of semiconductor fabrication will recognize diffusion regions 150 and 152 as suitable source/drain regions for a storage device 100 having a control gate 140 and an L-shaped transistor channel 103 including a first portion oriented perpendicular to the substrate upper surface and a second portion oriented parallel to the substrate upper surface. In this embodiment, the effective electrical length of a storage device 100 is determined by the trench etch process rather than by one or more photolithography steps. Two instances of storage device 100 are indicated in FIG. 9 by reference numerals 100-1 and 100-2.

Storage device 100 as depicted in FIG. 9 thus includes a control gate spacer 140 formed on and adjacent to portions of a charge storage stack 131 including a layer of DSEs 120 lining the sidewalls and floor of a trench 108 formed in substrate 102. A gap 145 exists between control gate spacers 140 formed on opposing sidewalls of a trench 108 and diffusion regions 150 in substrate 102 underlie the gaps 145. Diffusion regions 152 occupy an upper portion of substrate 102 between adjacent trenches 108. In this configuration, storage device 100 is a programmable storage cell transistor in which diffusion regions 150 and 152 serve as the transistor source/drain regions located at opposite ends of L-shaped channel 103. The DSEs 120 in storage stack 131 include a first programmable injection region 114-1 proximal to diffusion region 152 and a second, independently programmable, injection region 114-2 proximal to diffusion region 150-1. Each injection region 114 encompasses a corresponding portion of DSEs 120. More specifically, each injection region 114 represents a region of DSEs 120 on which charge is stored to program a corresponding bit of information. Storage device 100-2 as shown in FIG. 9 includes analogous injection regions 114-3 and 114-4.

Figures 10, 11:
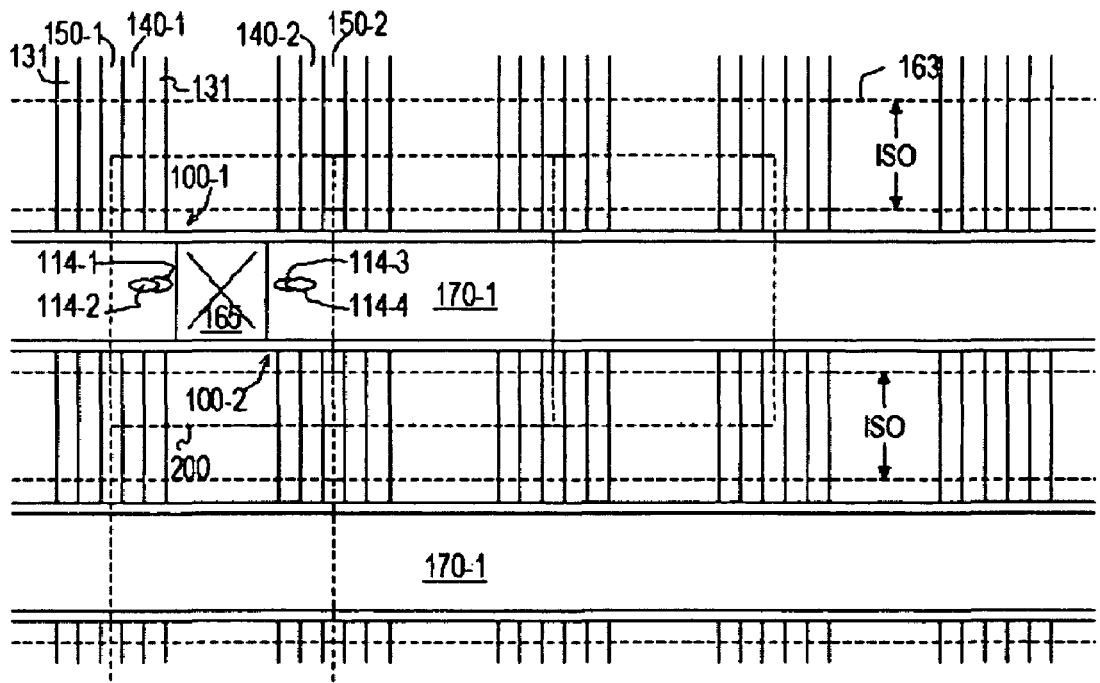
FIG. 10 is a top view of an array of the storage devices of FIG. 9.
FIG. 11 is a programming table for the hot carrier injection regions of the storage device of FIG. 9.

In FIG. 10, a top view of the storage device 100 depicted in FIG. 9 emphasizes storage device 100 as part of an array 201 of storage cells 200. In the depicted embodiment, storage cell 200 includes a pair of storage devices 100-1 and 100-2 (as well as others not shown), each of which includes a pair of programmable injection regions 114. In the depicted embodiment of storage cell 200 and array 201, control gate spacers 140 and the diffusion regions 150 extend in parallel fashion across array 201.

Contacts to diffusion regions 150 may be made using two different approaches. Diffusion regions 150 are electrically continuous structures that run below the substrate lower surface. In one approach, there are no contacts to diffusion regions 150 within a storage cell 200. Instead, diffusion regions 150 are contacts outside of or at the periphery of storage array 201. In this approach, the width of diffusion region 150 may "flare" out at the array periphery to provide sufficient space for a contact. If adjacent source/drain regions 150 are close together, this flaring of the source/drain regions may require staggering the flared portion at the periphery. In another embodiment, array 201 includes a metalization interconnect (not depicted) running perpendicular to interconnects 170, that makes "local" contact (not depicted) to the underlying diffusion region 150 in each "row" of array 201. The local contact embodiment, using multiple contacts to a diffusion region, while decreasing density, provides potentially improved performance through reduced contact resistance.

Interconnects 170-1 and 170-2, and others not shown in FIG. 9, contact diffusion regions 152 through contacts 165. FIG. 10 emphasizes cell-to-cell defined by striped mask 163. Striped mask 163, in conjunction with appropriate implantation steps, creates junction isolation within array 201 by alternating the conductivity type adjacent rows in array 201. In some embodiments, the portions of substrate 102 not covered by interconnects 170 provide isolation between adjacent diffusion regions 152. The isolation may be provided by a conventional dielectric isolation or by silicon of an opposite polarity to diffusion region 152. Isolation between adjacent diffusion regions 152 is desirable to reduce "disturb" effects when programming a first storage device causes a change in the state of another storage device.

Storage device 100 includes a pair of injection regions 114-1 and 114-2 programmable using hot carrier injection (HCI) programming. Programming table 161 of FIG. 11 indicates biasing conditions for programming HCI injection regions 114-1 through 114-4. The programming conditions listed are for NMOS embodiments of storage device 100. Opposite polarities apply for PMOS embodiments.

Programming a first bit of storage device 100-1 by injecting electrons into HCI injection region 114-1 includes biasing diffusion region 152 to a first programming voltage ($V_{P1}$), biasing control gate 140-1 to a second programming voltage ($V_{P2}$), and biasing diffusion region 150-1 and substrate 102 (also called "WELL 102" in FIG. 11) to a fourth programming voltage ($V_{P4}$). For one NMOS embodiment of storage cell 100, $V_{P1}$ and $V_{P2}$ are both in the range of approximately 5 V to 9 V while $V_{P4}$ is 0 V (ground). Programming a second bit of storage device 100-1 by injecting electrons into HCI injection region 114-2 includes biasing diffusion region 150-1 to $V_{P1}$, biasing control gate 140-1 to $V_{P2}$, and biasing diffusion region 152 and substrate 102 to $V_{P4}$. Programming a first bit of storage device 100-2 by injecting electrons into HCI injection region 114-3 includes biasing diffusion region 152 to $V_{P1}$, biasing control gate 140-2 to $V_{P2}$, and biasing diffusion region 150-2 and substrate 102 to $V_{P4}$. Programming a second bit of storage device 100-2 by injecting electrons into HCI injection region 114-4 includes biasing diffusion region 150-2 to $V_{P1}$, biasing control gate 140-2 to $V_{P2}$, and biasing diffusion region 152 and substrate 102 to $V_{P4}$. Exemplary programming voltage values are included in table 161. These voltages are preferably applied to storage device 100 for a specified duration, which is preferably on the order of microseconds.

In the foregoing specification, the disclosure has been described with reference to specific embodiments. However, one of ordinary skill in the art appreciates that various modifications and changes can be made without departing from the scope of the present invention as set forth in the claims below. For example, although the depicted embodiment is an NMOS transistor embodiment, PMOS embodiments are equally encompassed. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An array of storage cells wherein at least one of the storage cells comprises:
   a semiconductor substrate including an uppermost surface and a first trench extending from the uppermost surface;
   a first diffusion region underlying a portion of a first trench defined in the semiconductor substrate wherein a conductivity type of the first diffusion region is opposite a conductivity type of the semiconductor substrate;
   a second diffusion region occupying an upper portion of the semiconductor substrate adjacent to the first trench wherein a conductivity type of the second diffusion region is opposite the conductivity type of the semiconductor substrate;
   a charge storage stack lining sidewalls and a portion of a floor of the first trench wherein the charge storage stack includes a layer of discontinuous storage elements (DSEs); and
   electrically conductive spacers formed on sidewalls of the first trench adjacent to respective charge storage stacks, wherein substantially all of the electrically conductive spacers lie at elevations between an uppermost surface of the semiconductor substrate and a bottom of the trench.

2. The storage array of claim 1, wherein the DSEs include silicon nanocrystals.

3. The storage array of claim 1, wherein the spacers define a gap overlying the first diffusion region.

4. The storage array of claim 1, wherein the storage cell includes a first injection region within the layer of DSEs proximal to the second diffusion region and a second injection within the layer of DSEs proximal to the first diffusion region.

5. The storage array of claim 4, further comprising a second trench adjacent to the second diffusion region, charge storage stacks lining sidewalls of the second trench and conductive gate spacers adjacent to the charge storage stacks in the second trench and still farther comprising a diffusion region underlying a gap defined between the spacers in the second trench.

6. The storage array of claim 1, wherein the DSEs include DSEs underlying the conductive spacers.

7. The array of claim 1, wherein each storage cell includes a plurality of the DSEs.

8. The array of claim 1, wherein the electrically conductive spacers are control gates for the storage cells.

9. The array of claim 8, wherein within the first trench, the control gates are spaced apart from a center of the first trench.

10. The array of claim 1, wherein the second diffusion region lies at a wall of the first trench.

11. The array of claim 1, wherein all of the layer of the DSE lies at an elevation below an uppermost surface of the semiconductor substrate.

12. The array of claim 1, further comprising a plug lying within a center of the first trench, wherein the plug comprises a conductive center that contacts the first diffusion region.

13. The array of claim 1, wherein the electrically conductive spacers comprise polysilicon.

14. The array of claim 1, wherein the electrically conductive spacers comprise a metal material.

15. The array of claim 1, wherein the DSEs are silicon nanocrystals.

16. The array of claim 1, wherein the DSEs comprise a nitride.

17. The array of claim 1, wherein the DSEs comprise silicon nitride.

18. The array of claim 1, wherein the electrically conductive spacers are spaced apart from the DSEs.

19. The array of claim 18, further comprising a dielectric layer lying between the electrically conductive spacers and the DSEs.

20. The array of claim 1, further comprising a dielectric layer lying between the DSEs and a wall and a bottom of the first trench.

* * * * *

UNITED STATES PATENT AND TRADEMARK OFFICE
CERTIFICATE OF CORRECTION

PATENT NO. : 7,459,744 B2
APPLICATION NO. : 11/525747
DATED : December 2, 2008
INVENTOR(S) : Cheong M. Hong and Chi-Nan Li It is certified that error appears in the above-identified patent and that said Letters Patent is hereby corrected as shown below:

Column 8, Line 8, Please change "farthur" to --further--

Signed and Sealed this

Thirtieth Day of March, 2010

David J. Kappos
*Director of the United States Patent and Trademark Office*